United States Patent
Loccufier et al.

(10) Patent No.: US 11,466,166 B2
(45) Date of Patent: Oct. 11, 2022

(54) ETCH-RESISTANT INKJET INKS FOR MANUFACTURING PRINTED CIRCUIT BOARDS

(71) Applicant: AGFA-GEVAERT NV, Mortsel (BE)

(72) Inventors: Johan Loccufier, Mortsel (BE); Rita Torfs, Mortsel (BE)

(73) Assignee: AGFA-Gevaert NV, Mortsel (BE)

( * ) Notice: Subject to any disclaimer, the term of this patent is extended or adjusted under 35 U.S.C. 154(b) by 863 days.

(21) Appl. No.: 16/332,383

(22) PCT Filed: Sep. 1, 2017

(86) PCT No.: PCT/EP2017/071968
§ 371 (c)(1),
(2) Date: Mar. 12, 2019

(87) PCT Pub. No.: WO2018/050457
PCT Pub. Date: Mar. 22, 2018

(65) Prior Publication Data
US 2021/0277267 A1    Sep. 9, 2021

(30) Foreign Application Priority Data

Sep. 14, 2016 (EP) .................................... 16188702

(51) Int. Cl.
| | |
|---|---|
| C09D 11/38 | (2014.01) |
| H05K 3/06 | (2006.01) |
| C08K 5/17 | (2006.01) |
| H05K 3/12 | (2006.01) |
| C08K 5/20 | (2006.01) |
| C09D 11/101 | (2014.01) |
| C09D 11/103 | (2014.01) |
| C09D 11/105 | (2014.01) |
| C09D 11/102 | (2014.01) |
| C09D 11/106 | (2014.01) |
| C09D 11/107 | (2014.01) |
| C09D 11/104 | (2014.01) |

(52) U.S. Cl.
CPC ................ *C09D 11/38* (2013.01); *C08K 5/17* (2013.01); *C08K 5/20* (2013.01); *C09D 11/101* (2013.01); *C09D 11/102* (2013.01); *C09D 11/103* (2013.01); *C09D 11/104* (2013.01); *C09D 11/105* (2013.01); *C09D 11/106* (2013.01); *C09D 11/107* (2013.01); *H05K 3/061* (2013.01); *H05K 3/1241* (2013.01); *Y10S 148/051* (2013.01)

(58) Field of Classification Search
None
See application file for complete search history.

(56) References Cited

U.S. PATENT DOCUMENTS

| | | | | |
|---|---|---|---|---|
| 4,424,095 A | * | 1/1984 | Frisch | B29C 71/02 264/494 |
| 4,529,477 A | * | 7/1985 | Lundberg | H05K 3/0094 216/48 |
| 5,770,637 A | * | 6/1998 | Vanderlaan | G02B 1/043 351/159.63 |
| 6,849,308 B1 | * | 2/2005 | Speakman | H05K 3/1283 427/512 |
| 2006/0019077 A1 | * | 1/2006 | Hopper | C09D 11/30 428/209 |
| 2006/0047014 A1 | * | 3/2006 | Hopper | H05K 3/287 523/160 |
| 2009/0139433 A1 | | 6/2009 | Moszner et al. | |

FOREIGN PATENT DOCUMENTS

| | | |
|---|---|---|
| EP | 1 721 949 A1 | 11/2006 |
| EP | 2 033 949 A1 | 3/2009 |
| EP | 2 065 363 A1 | 6/2009 |
| EP | 2 130 817 A1 | 12/2009 |
| EP | 2 725 075 A1 | 4/2014 |
| WO | 2004/026977 A1 | 4/2004 |
| WO | 2004/106437 A1 | 12/2004 |

OTHER PUBLICATIONS

Official Communication issued in International Patent Application No. PCT/EP2017/071968, dated Oct. 16, 2017.

* cited by examiner

*Primary Examiner* — Shamim Ahmed
(74) *Attorney, Agent, or Firm* — Leydig, Voit & Mayer, Ltd.

(57) ABSTRACT

A radiation curable inkjet ink including an adhesion promoter including (1) at least one a free radical polymerizable group selected from the group consisting of an acrylate, a methacrylate, an acryl amide and a methacryl amide; (2) at least one aliphatic tertiary amine; and (3) at least one carboxylic acid or salt thereof with the proviso that the carboxylic acid is linked to an aliphatic tertiary amine via a divalent linking group selected from the group consisting of an optionally substituted methylene group and an optionally substituted ethylene group.

14 Claims, No Drawings

ETCH-RESISTANT INKJET INKS FOR MANUFACTURING PRINTED CIRCUIT BOARDS

CROSS REFERENCE TO RELATED APPLICATIONS

This application is a 371 National Stage Application of PCT/EP2017/071968, filed Sep. 1, 2017. This application claims the benefit of European Application No. 16188702.1, filed Sep. 14, 2016, which is incorporated by reference herein in its entirety.

BACKGROUND OF THE INVENTION

1. Field of the Invention

The present invention relates to an etch-resistant inkjet ink and a method of manufacturing conductive patterns.

2. Description of the Related Art

Printed circuit boards are usually made by coating a photo resist layer on a copper sheet bonded to a non-conductive substrate, applying a temporary UV mask of a negative image of a desired conductive pattern, UV exposing the photo resist layer, removing the non-exposed photo resist layer by a developer, removing unwanted copper by etching, removing the exposed photo resist layer by an alkaline stripping bath, thereby leaving only the desired conductive copper pattern present on the non-conductive substrate.

Etching is the process of using a chemical, usually a strong acid or mordant, to cut into the unprotected parts of a metal surface. The use of developer to remove the photo resist layer, often 50 µm thick or more, results in extra cost and chemical waste. Therefore, it has been investigated if the developing step could be eliminated by UV curable inkjet printing an etch-resistant inkjet ink layer on the copper sheet, which after etching is removed by the alkaline stripping bath to expose the conductive copper pattern.

Printed circuit boards (PCB) are typically manufactured in automated production lines wherein etching, rinsing and stripping are done in-line without intermediate drying. During all intermediate steps, the printed circuit board precursors come into contact with rollers in a wet state. To avoid unwanted damage of the conductive copper patterns, it is of crucial importance that the etch-resistant inkjet ink has a sufficient adhesion to the copper surface at all stages before stripping.

In the prior art, several approaches for maximizing the adhesion of etch-resistant inkjet inks onto different metal substrates have been disclosed, mainly focusing on polymerizable adhesion promoters.

WO2004026977 (Avecia) discloses a non-aqueous etch-resistant inkjet ink comprising 1 to 30 w % of an acrylate functional monomer containing one or more acidic group as adhesion promoter and dissolution promoter during stripping.

WO2004/106437 (Avecia) discloses an etch-resistant inkjet ink preferably comprising (meth)acrylate acid adhesion promoters, such as (meth)acrylated carboxylic acids, (meth)acrylated phosphoric acid esters and (meth)acrylated sulphonic acids, a type of adhesion promoter often used in metal primers and dental applications.

It has been found that the adhesion promoters described above do not fulfil the adhesion demands in all circumstances of the PCB manufacturing process when implemented in an etch-resistant inkjet ink. Therefore, there is still a need for alternative adhesion promoters compatible with an etch-resistant inkjet ink.

SUMMARY OF THE INVENTION

In order to overcome the problems described above, in particular the adhesion of an etch-resistant inkjet ink onto the copper surface at all stages of a PCB manufacturing process, the present invention provides a radiation curable inkjet ink as defined below.

Further objects of the invention will become apparent from the description hereinafter.

DETAILED DESCRIPTION OF THE PREFERRED EMBODIMENTS

Definitions

The term "monofunctional" in e.g. monofunctional polymerizable compound means that the polymerizable compound includes one polymerizable group.

The term "difunctional" in e.g. difunctional polymerizable compound means that the polymerizable compound includes two polymerizable groups.

The term "polyfunctional" in e.g. polyfunctional polymerizable compound means that the polymerizable compound includes more than two polymerizable groups.

The term "alkyl" means all variants possible for each number of carbon atoms in the alkyl group i.e. methyl, ethyl, for three carbon atoms: n-propyl and isopropyl; for four carbon atoms: n-butyl, isobutyl and tertiary-butyl; for five carbon atoms: n-pentyl, 1,1-dimethyl-propyl, 2,2-dimethyl-propyl and 2-methyl-butyl, etc.

Unless otherwise specified a substituted or unsubstituted alkyl group is preferably a $C_1$ to $C_6$-alkyl group.

Unless otherwise specified a substituted or unsubstituted alkenyl group is preferably a $C_2$ to $C_6$-alkenyl group.

Unless otherwise specified a substituted or unsubstituted alkynyl group is preferably a $C_2$ to $C_6$-alkynyl group.

Unless otherwise specified a substituted or unsubstituted aralkyl group is preferably a phenyl or naphthyl group including one, two, three or more $C_1$ to $C_6$-alkyl groups.

Unless otherwise specified a substituted or unsubstituted alkaryl group is preferably a $C_7$ to $C_{20}$-alkyl group including a phenyl group or naphthyl group.

Unless otherwise specified a substituted or unsubstituted aryl group is preferably a phenyl group or naphthyl group.

Unless otherwise specified a substituted or unsubstituted heteroaryl group is preferably a five- or six-membered ring substituted by one, two or three oxygen atoms, nitrogen atoms, sulphur atoms, selenium atoms or combinations thereof.

The term "substituted", in e.g. substituted alkyl group means that the alkyl group may be substituted by other atoms than the atoms normally present in such a group, i.e. carbon and hydrogen. For example, a substituted alkyl group may include a halogen atom or a thiol group. An unsubstituted alkyl group contains only carbon and hydrogen atoms.

Unless otherwise specified a substituted alkyl group, a substituted alkenyl group, a substituted alkynyl group, a substituted aralkyl group, a substituted alkaryl group, a substituted aryl and a substituted heteroaryl group are preferably substituted by one or more constituents selected from the group consisting of methyl, ethyl, n-propyl, isopropyl, n-butyl, isobutyl and tertiary-butyl, ester, amide, ether, thioether, ketone, aldehyde, sulfoxide, sulfone, sulfonate ester, sulphonamide, —Cl, —Br, —I, —OH, —SH, —CN and —NO$_2$.

Radiation Curable Inkjet Inks

The radiation curable inkjet ink of the present invention includes an adhesion promoter comprising:
(1) at least one free radical polymerizable group selected from the group consisting of an acrylate, a methacrylate, an acryl amide and a methacryl amide;
(2) at least one aliphatic tertiary amine; and
(3) at least one carboxylic acid or salt thereof, with the proviso that the carboxylic acid is linked to an aliphatic tertiary amine via a divalent linking group selected from the group consisting of an optionally substituted methylene group and an optionally substituted ethylene group.

The radiation curable inkjet ink can be cured by any type of radiation, for example by electron-beam radiation, but is preferably cured by UV radiation, more preferably by UV radiation from UV LEDs. The radiation curable inkjet ink is thus preferably a UV curable inkjet ink.

For reliable industrial inkjet printing, the viscosity of the radiation curable inkjet inks is preferably no more than 20 mPa·s at 45° C., more preferably between 1 and 18 mPa·s at 45° C., and most preferably between 4 and 14 mPa·s at 45° C.

For good image quality and adhesion, the surface tension of the radiation curable inkjet inks is preferably in the range of 18 mN/m to 70 mN/m at 25° C., more preferably in the range of about 20 mN/m to about 40 mN/m at 25° C.

The radiation curable inkjet ink may further comprise other polymerizable compounds, colorants, polymeric dispersants, a photoiniator or photoinitiating system, a polymerization inhibitor, or a surfactant.

Adhesion Promoter

The adhesion promoter comprises:
(1) at least one free radical polymerizable group selected from the group consisting of an acrylate, a methacrylate, an acryl amide and a methacryl amide;
(2) at least one aliphatic tertiary amine; and
(3) at least one carboxylic acid or salt thereof, with the proviso that the carboxylic acid is linked to an aliphatic tertiary amine via a divalent linking group selected from the group consisting of an optionally substituted methylene group and an optionally substituted ethylene group.

Adhesion promoters as described above have been disclosed in GB1464250 (Ciba-Geigy) as stabilizing chelating compounds to avoid spontaneous polymerisation in anaerobically curing adhesives; in EP1721949 (VOCO Gmbh) for dental applications claiming a better biocompatibility in comparison with the classically used highly acidic adhesion promoters; and in EP2065363 (Ivoclar Viovadent) as adhesives having an enhanced hydrolytical stability in dental applications.

The free radical polymerizable group is preferably selected from the group consisting of an acrylate and a methacrylate.

The divalent linking group is preferably an optionally substituted methylene group.

The adhesion promoter preferably comprises at least two carboxylic acids or salts thereof, linked to an aliphatic tertiary amine via an optionally substituted methylene group.

According to a preferred embodiment, the adhesion promoter comprises at least one structural unit according to Formula I,

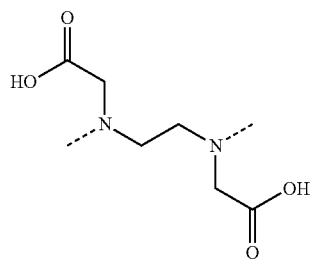

Formula I wherein
the dashed lines represent covalent bonds to other parts of the adhesion promoter.

According to a more preferred embodiment, the adhesion promoter comprises at least one structural unit according to Formula II,

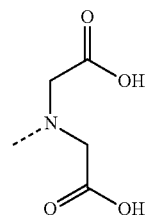

Formula II wherein
the dashed line represents a covalent bond to another part of the adhesion promoter.

According to a particularly preferred embodiment, the adhesion promoter comprises at least one structural unit according to Formula III,

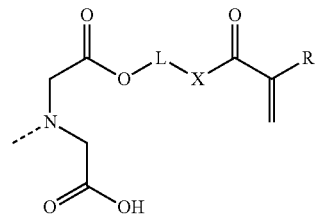

Formula III wherein
X is selected from the group consisting of O and NH;
R is selected from a hydrogen or a methyl group; and
L represents a divalent linking group comprising from 2 to 15 carbon atoms.

Preferably, the adhesion promoter comprises at least two structural units according to Formula III.

Preferably, X represents an oxygen atom and L represents a divalent linking group selected from the group consisting of an optionally substituted ethylene group, an optionally substituted propylene group and an optionally substituted butylene group, an ethylene group being particularly preferred.

Particularly preferred adhesion promoters according to the present invention are given in Table 1 without being limited thereto.

TABLE 1
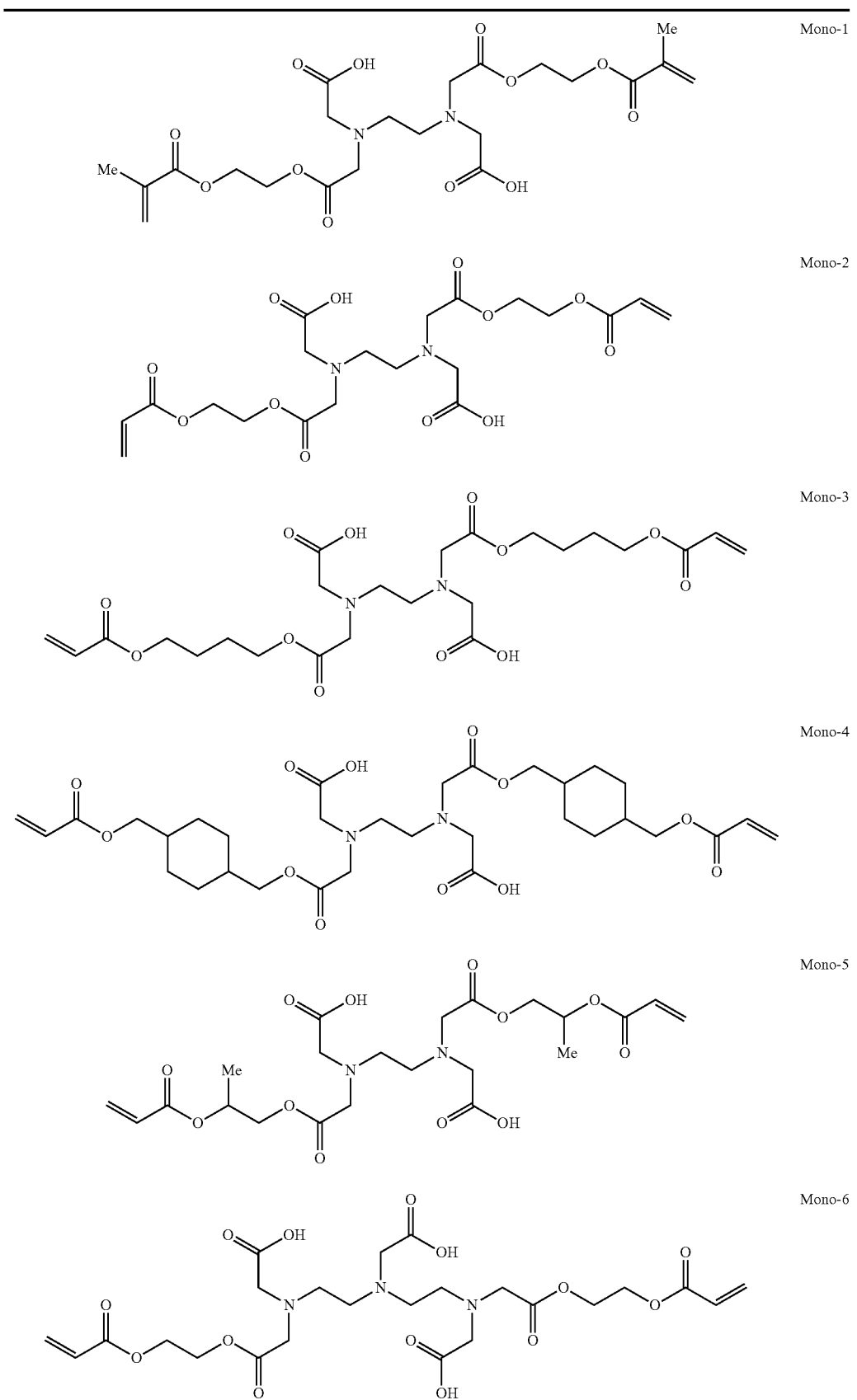

TABLE 1-continued

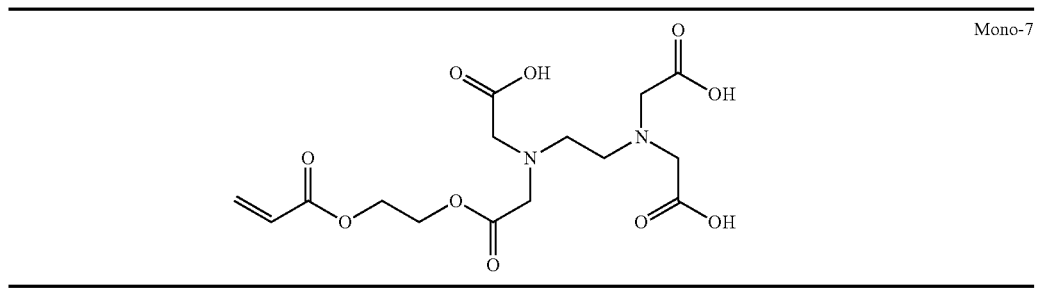

Mono-7

The amount of adhesion promoter in the radiation curable inkjet ink is preferably between 1 and 20 wt %, more preferably between 5 and 15 wt %, most preferably between 7.5 and 12.5 wt %, relative to the total weight of the inkjet ink.

When the amount is too low, the adhesion of the inkjet ink to the metal surface may be insufficient, when the amount is too high, the ink viscosity may increase and the shelf life may become more critical.

Other Polymerizable Compounds

Besides the adhesion promoter described above, the radiation curable inkjet ink preferably comprise other polymerizable compounds.

The other polymerizable compounds may be monomers, oligomers and/or prepolymers. These monomers, oligomers and/or prepolymers may possess different degrees of functionality. A mixture including combinations of mono-, di-, tri- and higher functionality monomers, oligomers and/or prepolymers may be used. The viscosity of the radiation curable inkjet ink may be adjusted by varying the ratio between the monomers and oligomers.

Particularly preferred monomers and oligomers are those listed in [0106] to [0115] in EP-A 1911814.

The radiation curable inkjet ink preferably includes a polymerizable composition comprising from 15 to 70 wt %, more preferably from 20 to 65 wt %, and most preferably from 30 to 60 wt %, of an acryl amide, relative to the total weight of the polymerizable composition.

The polymerizable composition of the radiation curable inkjet ink is the sum of all polymerizable compounds in the inkjet ink.

A single acryl amide or a mixture of acryl amides may be used.

Preferred acryl amides are disclosed in Table 2.

TABLE 2

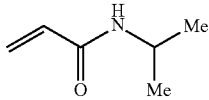 AA-1

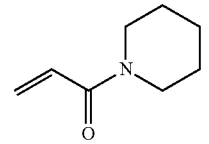 AA-2

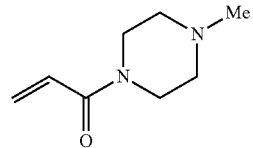 AA-3

TABLE 2-continued

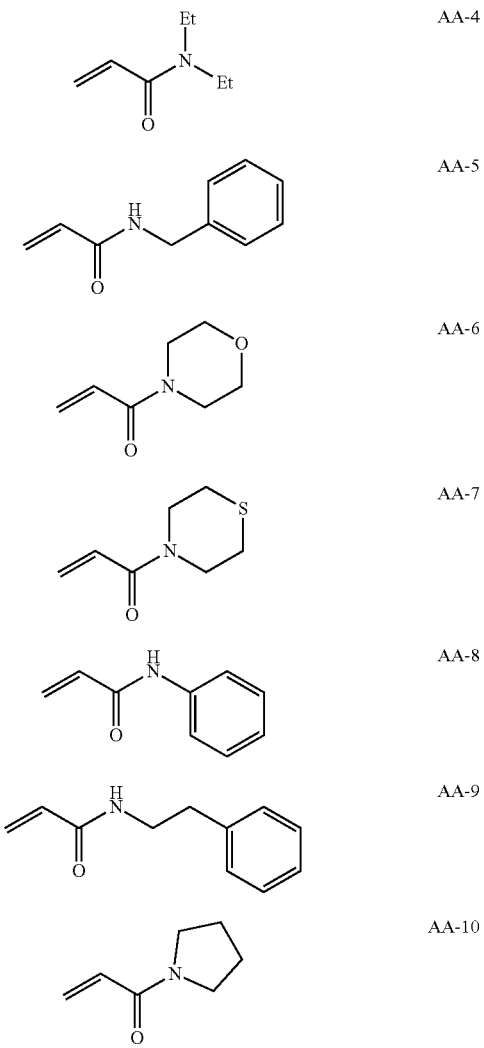

In a preferred embodiment of the radiation curable inkjet ink, the acryl amide is a cyclic acryl amide.

In the most preferred embodiment of the radiation curable inkjet ink, the acryl amide is acryloyl morpholine.

The radiation curable inkjet ink preferably includes a polymerizable composition comprising from 20 to 75 wt %, more preferably from 30 to 65 wt %, and most preferably from 40 to 55 wt % of a di- or polyfunctional acrylate in the polymerizable composition, relative to the total weight of the polymerizable composition.

A single di- or polyfunctional acrylate or a mixture of di- or polyfunctional acrylates may be used.

In a preferred embodiment, the di- or polyfunctional acrylate is selected from the group consisting of dipropylene glycol diacrylate, neopentylglycol diacrylate, neopentylglycol (2x propoxylated) diacrylate, penta erythritol tetraacrylate, 1,6-hexanediol diacrylate, trimethylolpropane triacrylate, ethoxylated trimethylolpropane triacrylate, tripropylene glycol diacrylate, ditrimethyloylpropane tetraacrylate, ethoxylated pentaerythritol tetraacrylate, and polyethyleneglycol diacrylate.

In a most preferred embodiment of the radiation curable inkjet ink, the di- or polyfunctional acrylate includes a neopentylglycol hydroxy pivalate diacrylate.

In a preferred embodiment, the radiation curable inkjet ink comprises an adhesion promoter according to the present invention and described above, an acryl amide as described above, and a di- or polyfunctional acrylate as described above.

In a particular preferred embodiment the radiation curable inkjet ink comprises a polymerizable composition wherein at least 80 wt %, preferably at least 90 wt % and most preferably 100 wt % of the polymerizable composition consists of:
- 15 to 70 wt % of an acryl amide as described above;
- 20 to 75 wt % of a di- or polyfunctional acrylate as described above; and
- 1 to 15 wt % of the adhesion promoter as described above.

Colorants

The radiation curable inkjet may be a substantially colourless inkjet ink, but preferably the radiation curable inkjet includes at least one colorant. The colorant makes the temporary mask clearly visible to the manufacturer of conductive patters, allowing a visual inspection of quality.

The colorant may be a pigment or a dye, but is preferably a dye that is not bleached by an UV curing step during the inkjet printing process of the radiation curable inkjet. The pigments may be black, white, cyan, magenta, yellow, red, orange, violet, blue, green, brown, mixtures thereof, and the like. A colour pigment may be chosen from those disclosed by HERBST, Willy, et al. Industrial Organic Pigments, Production, Properties, Applications. 3rd edition. Wiley-VCH, 2004. ISBN 3527305769.

Suitable pigments are disclosed in paragraphs [0128] to [0138] of WO2008/074548.

Pigment particles in inkjet inks should be sufficiently small to permit free flow of the ink through the inkjet-printing device, especially at the ejecting nozzles. It is also desirable to use small particles for maximum colour strength and to slow down sedimentation. Most preferably, the average pigment particle size is no larger than 150 nm. The average particle size of pigment particles is preferably determined with a Brookhaven Instruments Particle Sizer BI90plus based upon the principle of dynamic light scattering.

Generally dyes exhibit a higher light fading than pigments, but cause no problems on jettability. It was found that anthraquinone dyes exhibit only minor light fading under the normal UV curing conditions used in UV curable inkjet printing.

In a preferred embodiment, the colorant in the radiation curable inkjet ink is an anthraquinone dye, such as Macrolex™ Blue 3R (CASRN 325781-98-4) from LANXESS.

Other preferred dyes include crystal violet and a copper phthalocyanine dye.

In a preferred embodiment, the colorant is present in an amount of 0.5 to 6.0 wt %, more preferably 1.0 to 2.5 wt %, based on the total weight of the radiation curable inkjet ink.

Polymeric Dispersants

If the colorant in the radiation curable inkjet is a pigment, then the radiation curable inkjet preferably contains a dispersant, more preferably a polymeric dispersant, for dispersing the pigment.

Suitable polymeric dispersants are copolymers of two monomers but they may contain three, four, five or even more monomers. The properties of polymeric dispersants depend on both the nature of the monomers and their distribution in the polymer. Copolymeric dispersants preferably have the following polymer compositions:
- statistically polymerized monomers (e.g. monomers A and B polymerized into ABBAABAB);
- alternating polymerized monomers (e.g. monomers A and B polymerized into ABABABAB);
- gradient (tapered) polymerized monomers (e.g. monomers A and B polymerized into AAABAABBABBB);
- block copolymers (e.g. monomers A and B polymerized into AAAAABBBBBB) wherein the block length of each of the blocks (2, 3, 4, 5 or even more) is important for the dispersion capability of the polymeric dispersant;
- graft copolymers (graft copolymers consist of a polymeric backbone with polymeric side chains attached to the backbone); and
- mixed forms of these polymers, e.g. blocky gradient copolymers.

Suitable polymeric dispersants are listed in the section on "Dispersants", more specifically [0064] to [0070] and to [0077], in EP-A 1911814.

Commercial examples of polymeric dispersants are the following:
- DISPERBYK™ dispersants available from BYK CHEMIE GMBH;
- SOLSPERSE™ dispersants available from NOVEON;
- TEGO™ DISPERS™ dispersants from EVONIK;
- EDAPLAN™ dispersants from MÜNZING CHEMIE;
- ETHACRYL™ dispersants from LYONDELL;
- GANEX™ dispersants from ISP;
- DISPEX™ and EFKA™ dispersants from CIBA SPECIALTY CHEMICALS INC;
- DISPONER™ dispersants from DEUCHEM; and
- JONCRYL™ dispersants from JOHNSON POLYMER.

Photoinitiators and Photoinitiating Systems

The radiation curable inkjet preferably contains at least one photoinitiator, but may contain a photoinitiating system including a plurality of photoinitiators and/or co-initiators.

The photoinitiator in the radiation curable inkjet is preferably a free radical initiator, more specifically a Norrish type I initiator or a Norrish type II initiator. A free radical photoinitiator is a chemical compound that initiates polymerization of monomers and oligomers when exposed to actinic radiation by the formation of a free radical. A Norrish Type I initiator is an initiator which cleaves after excitation, yielding the initiating radical immediately. A Norrish type II-initiator is a photoinitiator which is activated by actinic radiation and forms free radicals by hydrogen abstraction from a second compound that becomes the actual initiating free radical. This second compound is called a polymerization synergist or co-initiator. Both type I and type II photoinitiators can be used in the present invention, alone or in combination.

Suitable photoinitiators are disclosed in CRIVELLO, J. V., et al. Photoinitiators for Free Radical Cationic and Anionic Photopolymerization. 2nd edition. Edited by BRADLEY, G. London, UK: John Wiley and Sons Ltd, 1998. p. 287-294.

Specific examples of photoinitiators may include, but are not limited to, the following compounds or combinations thereof: benzophenone and substituted benzophenones, 1-hydroxycyclohexyl phenyl ketone, thioxanthones such as isopropylthioxanthone, 2-hydroxy-2-methyl-1-phenylpropan-1-one, 2-benzyl-2-dimethylamino-(4-morpholinophenyl) butan-1-one, benzyl dimethylketal, bis (2,6-dimethylbenzoyl)-2,4,4-trimethylpentylphosphine oxide, 2,4,6 trimethylbenzoyl-diphenylphosphine oxide, 2,4,6-trimethoxybenzoyldiphenylphosphine oxide, 2-methyl-1-[4-(methylthio) phenyl]-2-morpholinopropan-1-one, 2,2-dimethoxy-1, 2-diphenylethan-1-one or 5,7-diiodo-3-butoxy-6-fluorone.

Suitable commercial photoinitiators include Irgacure™ 184, Irgacure™ 500, Irgacure™ 369, Irgacure™ 1700, Irgacure™ 651, Irgacure™ 819, Irgacure™ 1000, Irgacure™ 1300, Irgacure™ 1870, Darocur™ 1173, Darocur™ 2959, Darocur™ 4265 and Darocur™ ITX available from CIBA SPECIALTY CHEMICALS, Lucerin™ TPO available from BASF AG, Esacure™ KT046, Esacure™ KIP150, Esacure™ KT37 and Esacure™ EDB available from LAMBERTI, H-Nu™ 470 and H-Nu™ 470X available from SPECTRA GROUP Ltd.

The photoinitiator may be a so-called diffusion hindered photoinitiator. A diffusion hindered photoinitiator is a photoinitiator which exhibits a much lower mobility in a cured ink layer than a monofunctional photoinitiator, such as benzophenone. Several methods can be used to lower the mobility of the photoinitiator. One way is to increase the molecular weight of the photoinitiators so that the diffusion speed is reduced, e.g. polymeric photoinitiators. Another way is to increase its reactivity so that it is built into the polymerizing network, e.g. multifunctional photoinitiators (having 2, 3 or more photoinitiating groups) and polymerizable photoinitiators.

The diffusion hindered photoinitiator for the radiation curable inkjet is preferably selected from the group consisting of non-polymeric multifunctional photoinitiators, oligomeric or polymeric photoinitiators and polymerizable photoinitiators. Most preferably the diffusion hindered photoinitiator is a polymerizable initiator or a polymeric photoinitiator.

A preferred diffusion hindered photoinitiator contains one or more photoinitiating functional groups derived from a Norrish type I-photoinitiator selected from the group consisting of benzoinethers, benzil ketals, α,α-dialkoxyacetophenones, α-hydroxyalkylphenones, α-aminoalkylphenones, acylphosphine oxides, acylphosphine sulphides, α-haloketones, α-halosulfones and phenylglyoxalates.

A preferred diffusion hindered photoinitiator contains one or more photoinitiating functional groups derived from a Norrish type II-initiator selected from the group consisting of benzophenones, thioxanthones, 1,2-diketones and anthraquinones.

Suitable diffusion hindered photoinitiators are also those disclosed in EP-A 2065362 in paragraphs [0074] and [0075] for difunctional and multifunctional photoinitiators, in paragraphs [0077] to [0080] for polymeric photoinitiators and in paragraphs [0081] to [0083] for polymerizable photoinitiators.

A preferred amount of photoinitiator is 0.1-20 wt %, more preferably 2-15 wt %, and most preferably 3-10 wt % of the total weight of the radiation curable inkjet.

In order to increase the photosensitivity further, the radiation curable inkjet may additionally contain co-initiators. Suitable examples of co-initiators can be categorized in three groups: 1) tertiary aliphatic amines such as methyldiethanolamine, dimethylethanolamine, triethanolamine, triethylamine and N-methylmorpholine; (2) aromatic amines such as amylparadimethyl-aminobenzoate, 2-n-butoxyethyl-4-(dimethylamino) benzoate, 2-(dimethylamino)-ethylbenzoate, ethyl-4-(dimethylamino)benzoate, and 2-ethylhexyl-4-(dimethylamino)benzoate; and (3) (meth)acrylated amines such as dialkylamino alkyl(meth)acrylates (e.g., diethylaminoethylacrylate) or N-morpholinoalkyl-(meth)acrylates (e.g., N-morpholinoethyl-acrylate). The preferred co-initiators are aminobenzoates.

When one or more co-initiators are included into the radiation curable inkjet ink, preferably these co-initiators are diffusion hindered for safety reasons.

A diffusion hindered co-initiator is preferably selected from the group consisting of non-polymeric di- or multifunctional co-initiators, oligomeric or polymeric co-initiators and polymerizable co-initiators. More preferably the diffusion hindered co-initiator is selected from the group consisting of polymeric co-initiators and polymerizable co-initiators. Most preferably the diffusion hindered co-initiator is a polymerizable co-initiator having at least one (meth) acrylate group, more preferably having at least one acrylate group.

The radiation curable inkjet ink preferably includes a polymerizable or polymeric tertiary amine co-initiator.

Preferred diffusion hindered co-initiators are the polymerizable co-initiators disclosed in EP-A 2053101 in paragraphs [0088] and [0097].

The radiation curable inkjet inks preferably includes the (diffusion hindered) co-initiator in an amount of 0.1 to 20 wt %, more preferably in an amount of 0.5 to 15 wt %, most preferably in an amount of 1 to 10 wt % of the total weight of the radiation curable inkjet ink.

Polymerization Inhibitors

The radiation curable inkjet ink may contain at least one inhibitor for improving the thermal stability of the ink.

Suitable polymerization inhibitors include phenol type antioxidants, hindered amine light stabilizers, phosphor type antioxidants, hydroquinone monomethyl ether commonly used in (meth)acrylate monomers, and hydroquinone, t-butyl-catechol, pyrogallol, 2,6-di-tert.butyl-4-methylphenol (=BHT) may also be used.

Suitable commercial inhibitors are, for example, Sumilizer™ GA-80, Sumilizer™ GM and Sumilizer™ GS produced by Sumitomo Chemical Co. Ltd.; Genorad™ 16, Genorad™ 18 and Genorad™ 20 from Rahn AG; Irgastab™UV10 and Irgastab™ UV22, Tinuvin™ 460 and CGS20 from Ciba Specialty Chemicals; Floorstab™ UV range (UV-1, UV-2, UV-5 and UV-8) from Kromachem Ltd, Additol™ S range (S100, 5110, 5120 and 5130) from Cytec Surface Specialties.

The inhibitor is preferably a polymerizable inhibitor.

Since excessive addition of these polymerization inhibitors may lower the curing speed, it is preferred that the amount capable of preventing polymerization is determined prior to blending. The amount of a polymerization inhibitor is preferably lower than 5 wt %, more preferably lower than 3 wt % of the total radiation curable inkjet ink.

Surfactants

The radiation curable inkjet may contain at least one surfactant, but preferably no surfactant is present. If no surfactant is present, the radiation curable inkjet ink does not spread well on the metal sheet, allowing the generation of thin conductive lines.

The surfactant can be anionic, cationic, non-ionic, or zwitter-ionic and is usually added in a total quantity less than 1 wt % based on the total weight of the radiation curable inkjet ink.

Suitable surfactants include fluorinated surfactants, fatty acid salts, ester salts of a higher alcohol, alkylbenzene sulfonate salts, sulfosuccinate ester salts and phosphate ester salts of a higher alcohol (for example, sodium dodecylbenzenesulfonate and sodium dioctylsulfosuccinate), ethylene oxide adducts of a higher alcohol, ethylene oxide adducts of an alkylphenol, ethylene oxide adducts of a polyhydric alcohol fatty acid ester, and acetylene glycol and ethylene oxide adducts thereof (for example, polyoxyethylene nonylphenyl ether, and SURFYNOL™ 104, 104H, 440, 465 and TG available from AIR PRODUCTS & CHEMICALS INC.).

Preferred surfactants are selected from fluoric surfactants (such as fluorinated hydrocarbons) and silicone surfactants. The silicone surfactants are preferably siloxanes and can be alkoxylated, polyether modified, polyether modified hydroxy functional, amine modified, epoxy modified and other modifications or combinations thereof. Preferred siloxanes are polymeric, for example polydimethylsiloxanes.

Preferred commercial silicone surfactants include BYK™ 333 and BYK™ UV3510 from BYK Chemie.

In a preferred embodiment, the surfactant is a polymerizable compound.

Preferred polymerizable silicone surfactants include a (meth)acrylated silicone surfactant. Most preferably the (meth)acrylated silicone surfactant is an acrylated silicone surfactant, because acrylates are more reactive than methacrylates.

In a preferred embodiment, the (meth)acrylated silicone surfactant is a polyether modified (meth)acrylated polydimethylsiloxane or a polyester modified (meth)acrylated polydimethylsiloxane.

Preferably the surfactant is present in the radiation curable inkjet ink in an amount of 0 to 3 wt % based on the total weight of the radiation curable inkjet ink.

Preparation of Inkjet Inks

The preparation of pigmented radiation curable inkjet inks is well-known to the skilled person. Preferred methods of preparation are disclosed in paragraphs [0076] to [0085] of WO2011/069943.

Methods of Inkjet Printing and Manufacturing Conductive Patterns

A method of inkjet printing according to the present invention includes the steps of:
  a) forming a protected area on a metal or glass surface by printing and curing a radiation curable inkjet ink as described above on the metal surface;
  b) removing metal or glass from an unprotected area of the metal or glass surface by etching; and
  c) removing at least partially the cured radiation curable inkjet ink from the protected area of the metal or glass surface.

In one preferred embodiment, the inkjet printing method is used for manufacturing a conductive pattern. Such a conductive pattern is preferably used in the manufacture of Printed Circuit Boards (PCBs). In this case, the metal surface is preferably a metal foil or sheet attached to a substrate.

There is no real limitation on the type of substrate bonded to the metal sheet as long as it is non-conductive. The substrates may be made of a ceramic, glass or plastics, such as polyimides.

The metal sheet usually has a thickness between 9 and 105 µm.

There is no limitation on the nature of the metal surface. The metal surfaces preferably consist of copper, aluminium, nickel, iron, tin, titanium or zinc, but may be also alloys including these metals. In a very preferred embodiment, the metal surface is made of copper. Copper has a high electrical conductivity and is a relatively cheap metal, making it very suitable for making printed circuit boards.

In another preferred embodiment, the inkjet printing method is used for manufacturing a decorative etched metal panel.

The metal surface used may be selected from the metals described above for the embodiment wherein conductive patterns are prepared. In this case, preferably a solid metal panel is used. However, also a metal foil attached to a substrate may be used. There is no real limitation on the type of substrate bonded to the metal foil. The substrates may be made of a ceramic, glass or plastics, or even a second (cheaper) metal plate. The metal may also be an alloy.

Such a decorative metal panel may serve a purpose other than being purely decorative, such as providing information. For example, an aluminium name plate wherein the etch resistant radiation curable inkjet ink was printed as information, such as a name of a person or a company, and then removed to result in a glossy shiny name on a mat etched background, is also considered a decorative metal panel including a decorative element. Etching causes a change in optical properties of a metal surface, such as a change of gloss. After removal of the cured radiation curable inkjet ink from the metal surface an aesthetic effect is created between the etched and the non-etched metal surface.

In a preferred embodiment of the inkjet printing method, the metal surface is cleaned before printing the radiation curable inkjet ink. This is especially desirable when the metal surface is handled by hand and no gloves are worn. The cleaning removes dust particles and grease which can interfere in the adhesion of the Radiation curable inkjet ink to the metal surface.

In yet another preferred embodiment, the inkjet method is used for manufacturing a decorative etched glass panel. Such a method is disclosed in for example WO2013/189762 (AGC).

Etching

Etching of a metal surface, as in step b) of the inkjet printing method, is performed by using an etchant. The etchant is preferably an aqueous solution having a pH<3 or wherein 8<pH<10.

In a preferred embodiment, the etchant is an acid aqueous solution having a pH of less than 2. The acid etchant preferably includes at least one acid selected from the group consisting of nitric acid, picric acid, hydrochloric acid, hydrofluoric acid and sulphuric acid.

Preferred etchants known in the art include Kalling's No. 2, ASTM No. 30, Kellers Etch, Klemm's Reagent, Kroll's Reagent, Marble's Reagent, Murakami's Reagent, Picral and Vilella's Reagent.

In another preferred embodiment, the etchant is an alkaline aqueous solution having a pH of no more than 9. The alkaline etchant preferably includes at least one base selected from the group consisting of ammonia or ammonium hydroxide, potassium hydroxide and sodium hydroxide.

The etchant may also contain a metal salt such as copper dichloride, copper sulphate, potassium ferricyanide and iron trichloride.

Etching of a metal surface in PCB applications is preferably performed in a time frame of seconds to a few minutes, more preferably 5 to 150 seconds. Etching is preferably performed at a temperature between 35 and 50° C.

The etching time of a metal surface in other applications, such as in the manufacture or decorative metal panels, may be substantially longer, depending on the type and amount of metal that has to be removed during the etch step. Etching times may be more then 15, 30 or even 60 minutes.

In the method wherein a glass surface is etched, the etching solution is preferably an aqueous solution of hydrofluoric acid. Typically, the etching solution has a pH between 0 and 5.

Etching is preferably followed by rinsing with water to remove any residual etchant.

Stripping

After etching, the cured radiation curable inkjet ink must at least partially be removed from the metal surface, so that e.g. electric or electronic devices can make contact with the remaining metal surface (conductive pattern) or that the decorative feature of an etched metal panel becomes fully visible. For example, an electronic component such as a transistor must be able to make electrical contacts with the conductive (copper) pattern on the printed circuit board. In a preferred embodiment, the cured radiation curable inkjet ink is completely removed from the metal surface.

In a preferred embodiment, the cured radiation curable inkjet ink is removed from the protected area in step c) by an alkaline stripping bath. Such an alkaline stripping bath is usually an aqueous solution with a pH >10.

In another embodiment, the cured radiation curable inkjet ink is removed from the protected area in step c) by dry delamination. This technique of "dry stripping" is currently unknown in the art of manufacturing printed circuit boards and introduces several ecological and economical advantages in the manufacturing process. Dry stripping not only eliminates the need of a corrosive alkaline stripping bath and its inherent liquid waste, but also allows for a higher throughput. Dry stripping can be implemented, for example, by using an adhesive foil and a roll-to-roll laminator-delaminator. The adhesive foil is first laminated with its adhesive side onto the cured radiation curable inkjet ink present on the metal surface and subsequently delaminated thereby removing the cured radiation curable inkjet ink from the metal surface. Delamination by a roll-to-roll laminator-delaminator can be performed in seconds, while alkaline stripping can take minutes.

Inkjet Printing Devices

The radiation curable inkjet ink may be jetted by one or more print heads ejecting small droplets in a controlled manner through nozzles onto a substrate, which is moving relative to the print head(s).

A preferred print head for the inkjet printing system is a piezoelectric head. Piezoelectric inkjet printing is based on the movement of a piezoelectric ceramic transducer when a voltage is applied thereto. The application of a voltage changes the shape of the piezoelectric ceramic transducer in the print head creating a void, which is then filled with ink. When the voltage is again removed, the ceramic expands to its original shape, ejecting a drop of ink from the print head. However the inkjet printing method according to the present invention is not restricted to piezoelectric inkjet printing. Other inkjet print heads can be used and include various types, such as a continuous type.

The inkjet print head normally scans back and forth in a transversal direction across the moving ink-receiver surface. Often the inkjet print head does not print on the way back. Bi-directional printing is preferred for obtaining a high areal throughput. Another preferred printing method is by a "single pass printing process", which can be performed by using page wide inkjet print heads or multiple staggered inkjet print heads which cover the entire width of the metal plate. In a single pass printing process the inkjet print heads usually remain stationary and the metal substrate is transported under the inkjet print heads.

Curing Devices

The radiation curable inkjet ink can be cured by exposing them to actinic radiation, such as electron beam or ultraviolet radiation. Preferably the radiation curable inkjet ink is cured by ultraviolet radiation, more preferably using UV LED curing.

In inkjet printing, the curing means may be arranged in combination with the print head of the inkjet printer, travelling therewith so that the curable liquid is exposed to curing radiation very shortly after been jetted.

In such an arrangement, with the exception of UV LEDs, it can be difficult to provide a small enough radiation source connected to and travelling with the print head. Therefore, a static fixed radiation source may be employed, e.g. a source of curing UV-light, connected to the radiation source by means of flexible radiation conductive means such as a fibre optic bundle or an internally reflective flexible tube.

Alternatively, the actinic radiation may be supplied from a fixed source to the radiation head by an arrangement of mirrors including a mirror upon the radiation head.

The source of radiation may also be an elongated radiation source extending transversely across the substrate to be cured. It may be adjacent the transverse path of the print head so that the subsequent rows of images formed by the print head are passed, stepwise or continually, beneath that radiation source.

Any ultraviolet light source, as long as part of the emitted light can be absorbed by the photo-initiator or photo-initiator system, may be employed as a radiation source, such as, a high or low pressure mercury lamp, a cold cathode tube, a black light, an ultraviolet LED, an ultraviolet laser, and a flash light. Of these, the preferred source is one exhibiting a relatively long wavelength UV-contribution having a dominant wavelength of 300-400 nm. Specifically, a UV-A light source is preferred due to the reduced light scattering therewith resulting in more efficient interior curing.

UV radiation is generally classed as UV-A, UV-B, and UV-C as follows:

UV-A: 400 nm to 320 nm
UV-B: 320 nm to 290 nm
UV-C: 290 nm to 100 nm.

In a preferred embodiment, the radiation curable inkjet ink is cured by UV LEDs. The inkjet printing device preferably contains one or more UV LEDs preferably with a wavelength larger than 360 nm, preferably one or more UV LEDs with a wavelength larger than 380 nm, and most preferably UV LEDs with a wavelength of about 395 nm.

Furthermore, it is possible to cure the ink image using, consecutively or simultaneously, two light sources of differing wavelength or illuminance. For example, the first UV-source can be selected to be rich in UV-C, in particular in the range of 260 nm-200 nm. The second UV-source can then be rich in UV-A, e.g. a gallium-doped lamp, or a different lamp high in both UV-A and UV-B. The use of two UV-sources has been found to have advantages e.g. a fast curing speed and a high curing degree.

For facilitating curing, the inkjet printing device often includes one or more oxygen depletion units. The oxygen depletion units place a blanket of nitrogen or other relatively inert gas (e.g. $CO_2$), with adjustable position and adjustable inert gas concentration, in order to reduce the oxygen concentration in the curing environment. Residual oxygen levels are usually maintained as low as 200 ppm, but are generally in the range of 200 ppm to 1200 ppm.

EXAMPLES

Materials

All materials used in the following examples were readily available from standard sources such as ALDRICH CHEMICAL Co. (Belgium) and ACROS (Belgium) unless otherwise specified. The water used was deionized water.

SR606A is neopentylglycol hydroxypivalate diacrylate available as Sartomer™ SR606A from ARKEMA.

ACMO is acryloyl morpholine available from RAHN.

ITX is an isomeric mixture of 2- and 4-isopropylthioxanthone available as Darocur™ ITX from BASF.

TPO is 2,4,6-trimethylbenzoyl-diphenyl-phosphineoxide, a photoinitiator available as Darocur™ TPO from BASF.

EPD is ethyl 4-dimethyaminobenzoate available as Genocure™ EPD from RAHN.

CEA is 2-carboxyethyl acrylate from ALDRICH.

Polysurf HP is an acid adhesion promoter having the following structure supplied by ADD APT Chemicals BV.

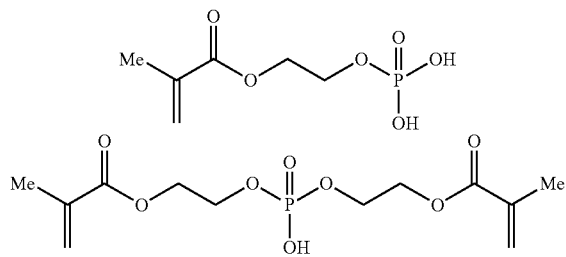

Polysurf HPACE is an acid adhesion promoter having the following structure supplied by ADD APT Chemicals BV.

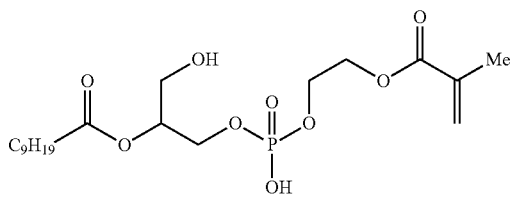

Polysurf HPL is an acid adhesion promoter having the following structure supplied by ADD APT Chemicals BV.

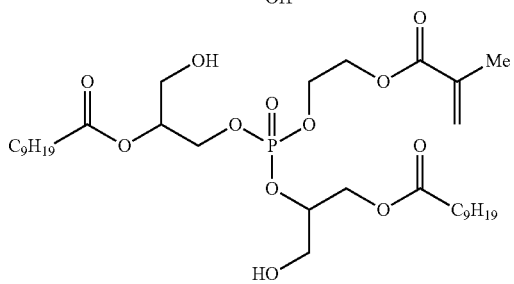

Polysurf HPH is an acid adhesion promoter having the following structure supplied by ADD APT Chemicals BV.

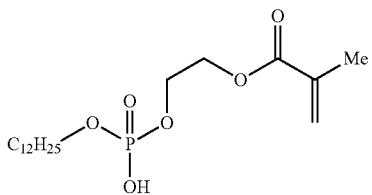

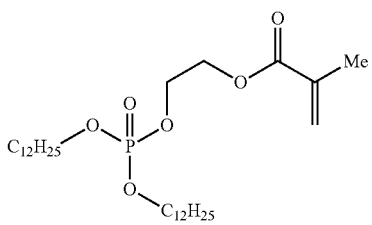

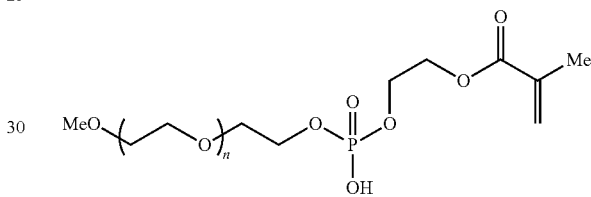

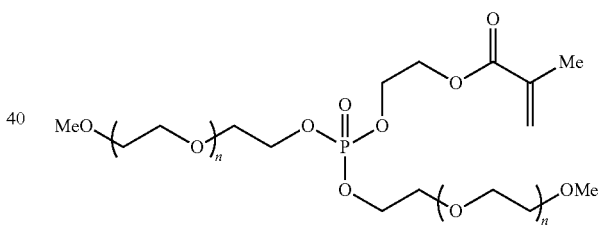

Mono-1 is an adhesion promoter according to the present invention synthesized as disclosed in the examples of EP-A 1721949 (VOCO GmbH).

CN146 is (2-acryloyloxyethyl) phthalate from ARKEMA.

INHIB is a mixture forming a polymerization inhibitor having a composition according to Table 3

TABLE 3

| Component | wt % |
|---|---|
| DPGDA | 82.4 |
| p-methoxyphenol | 4.0 |
| 2,6-di-tert-butyl-4-methylphenol | 10.0 |
| Cupferron ™ AL | 3.6 |

Cupferron™ AL is aluminum N-nitrosophenylhydroxylamine from WAKO CHEMICALS LTD.

Dye-1 is a blue anthraquinone dye available as Macrolex™ Blue 3R from LANXESS.

The $FeCl_3$ etch solution used is "Mega" acid etchant (pH=2) obtained from MEGA ELECTRONICS.

The CuCl$_2$ etch solution is a solution of 34.9 g copper(2) chloride hydrate in 80 g distilled water with 17 g HCl (37%).

Methods

Copper Cleaning

Isola™ 400 copper plates from CCI Eurolam were cleaned for 5 seconds at 25° C. with a solution called Mecbrite™ CA-95 from MEC Europe, which has pH<1 and contains H$_2$SO$_4$, H$_2$O$_2$ and Cu$^{2+}$. During this operation a thin top layer of Cu (0.3-0.5 µm) was removed. The plates were then rinsed with a water jet for 90 seconds, dried and used immediately.

Viscosity

The viscosity of the inks was measured at 45° C. and at a shear rate of 1000 s$^{-1}$ using a "Robotic Viscometer Type VISCObot" from CAMBRIDGE APPLIED SYSTEMS.

For industrial inkjet printing, the viscosity at 45° C. and at a shear rate of 1000 s$^{-1}$ is preferably between 5.0 and 15 mPa·s. More preferably the viscosity at 45° C. and at a shear rate of 1 000 s$^{-1}$ is less than 15 mPa·s.

Example 1

This example illustrates the superior wet adhesion properties of UV curable inkjet inks including adhesion promoters according to the present invention.

Comparative inks COMP-1 to COMP-5 and inventive ink INV-1

The comparative radiation curable inkjet inks COMP-1 to COMP-5 and the inventive radiation curable inkjet ink INV-1 were prepared according to Table 4. The weight percentages (wt %) are all based on the total weight of the radiation curable inkjet ink.

TABLE 4

| wt % of component | COMP-1 | COMP-2 | COMP-3 | COMP-4 | COMP-5 | INV-1 |
| --- | --- | --- | --- | --- | --- | --- |
| SR606 | 40 | 40 | 40 | 40 | 40 | 40 |
| ACMO | 36 | 36 | 36 | 36 | 36 | 36 |
| ITX | 4 | 4 | 4 | 4 | 4 | 4 |
| TPO | 4 | 4 | 4 | 4 | 4 | 4 |
| EPD | 4 | 4 | 4 | 4 | 4 | 4 |
| INHIB | 1 | 1 | 1 | 1 | 1 | 1 |
| DYE-1 | 1 | 1 | 1 | 1 | 1 | 1 |
| CEA | 10 | — | — | — | — | — |
| Polysurf HP | — | 10 | — | — | — | — |
| Polysurf HPACE | — | — | 10 | — | — | — |
| Polysurf HPL | — | — | — | 10 | — | — |
| Polysurf HPH | — | — | — | — | 10 | — |
| Mono-1 | — | — | — | — | — | 10 |

The viscosity of each of the inventive and comparative inks was measured as described above and the shelf life stability of the inks was determined by storing them at 80° C. for 7 days and re-measuring their viscosity. The results are summarized in Table 5.

TABLE 5

| UV curable ink jet ink | Viscosity, fresh (45° C., mPas) | Viscosity, 7 days 80° C. (45° C., mPas) |
| --- | --- | --- |
| COMP-1 | 11 | 12 |
| COMP-2 | 12.3 | >50 |
| COMP-3 | 12.1 | >50 |
| COMP-4 | 9 | >50 |
| COMP-5 | 12.1 | >50 |
| INV-1 | 10.7 | 11.6 |

Comparative test samples COMP-S-1 to COMP-S-5 and inventive test samples INV-S-1

Two patches of 5 by 10 cm of each of the radiation curable inkjet inks COMP-1 to COMP-5 and INV-1 were prepared by coating at a thickness of 10 µm on a cleaned Isola™ copper plate followed by curing on a Fusion DRSE-120 conveyer, equipped with a Fusion VPS/I600 lamp (D-bulb), which transported the samples for full curing twice under the UV-lamp on a conveyer belt at a speed of 20 m/min. The maximum output of the lamp was 1.05 J/cm$^2$ and a peak intensity of 5.6 W/cm$^2$.

Evaluation of the Wet Adhesion

The wet adhesion throughout the work flow for manufacturing a PCB was simulated as follows.

A first sample of each of the comparative test samples COMP-S-1 to COMP-S-5 and inventive test samples INV-S-1 was etched in a Rotaspray for 90 seconds at 50° C. using the CuCl$_2$ etch solution. The adhesion was tested by scratching the surface of the wet plates using a wet Q-tip. The adhesion was scored OK when the coating was undamaged. When part of the underlying copper was revealed, the adhesion was scored as nOK.

A second sample of the comparative test samples COMP-S-1 to COMP-S-5 and inventive test samples INV-S-1 was etched in a Rotaspray for 90 seconds at 50° C. using the CuCl$_2$ etch solution. The samples were then rinsed for 90 second with demineralised water and the adhesion test was repeated.

The results are summarized in Table 6.

TABLE 6

| Etch resist sample | Wet adhesion after etching | Wet adhesion after rinsing |
| --- | --- | --- |
| COMP-S-1 | OK | nOK |
| COMP-S-2 | OK | nOK |
| COMP-S-3 | OK | nOK |
| COMP-S-4 | OK | nOK |
| COMP-S-5 | nOK | nOK |
| INV-1 | OK | OK |

From the results of Table 5 and 6 can be concluded that only the UV curable etch resist ink according to the present invention combined a high shelf life stability and a guaranteed wet adhesion performance throughout the whole PCB manufacturing process.

Example 2

This example illustrates the compatibility of the etch resist inks according to the present invention with different etch conditions.

Comparative inks COMP-6, COMP-7 and inventive ink INV-2

The comparative inks COMP-6 and COMP-7 and the inventive ink INV-2 were prepared according to Table 7. The weight percentages (wt %) were all based on the total weight of the radiation curable inkjet ink.

TABLE 7

| wt % of component | COMP-6 | COMP-7 | INV-2 |
|---|---|---|---|
| SR606 | 40 | 40 | 40 |
| ACMO | 41 | 36 | 36 |
| ITX | 4 | 4 | 4 |
| TPO | 4 | 4 | 4 |
| EPD | 4 | 4 | 4 |
| INHIB | 1 | 1 | 1 |
| DYE-1 | 1 | 1 | 1 |
| CEA | 5 | — | — |
| CN146 | — | 10 | — |
| Mono-1 | — | — | 10 |

Comparative test samples COMP-S-6, COMP-S-7 and inventive test samples INV-S-2

The comparative samples COMP-S-6 and COMP-S-7 and the inventive test samples INV-S-2 were obtained by jetting the inks COMP-6 and COMP-7 and INV-2 on a freshly cleaned copper, using an Anapurna M printed in a unidirectional printing 8 pass printing mode at a resolution of 720*1440 DPI. The samples were cured using an H bulb on the printer at full power.

A first sample of each ink was etched in the $CuCl_2$ etch solution at 50° C. for 90 seconds, using a Rotaspray. The wet adhesion of each sample was tested directly after etching, by scratching the surface of the wet plates using a wet Q-tip. The adhesion was scored OK when the coating was undamaged. When part of the underlying copper was revealed, the adhesion was scored as nOK.

A second sample of each ink was etched in a $CuCl_2$ based etching chemistry as described above, but now followed by rinsing with demineralised water for 90 seconds. The percentage etch resist remaining on the surface was calculated and the wet adhesion after rinsing was evaluated again as described. A percentage of at least 95% is needed to guarantee sufficient production latitude in the manufacturing of printed circuit boards.

A third sample of each ink was etched in the $FeCl_3$ etch solution at 35° C. for 115 seconds. The wet adhesion of each sample was tested directly after etching, by scratching the surface of the wet plates using a Q-tip.

A fourth sample of each ink was etched in the $FeCl_3$ etch solution, but now followed by rinsing with demineralised water for 90 seconds. The percentage etch resist remaining on the surface was calculated and the wet adhesion after rinsing was evaluated again as described above.

The evaluation results are summarized in Table 8.

TABLE 8

| UV curable ink jet ink | Wet adhesion etching ($CuCl_2$) | Wet adhesion rinsing ($CuCl_2$) | % remaining ($CuCl_2$) | Wet adhesion etching ($FeCl_3$) | Wet adhesion rinsing ($FeCl_3$) | % remaining ($FeCl_3$) |
|---|---|---|---|---|---|---|
| COMP-6 | nOK | nOK | 15 | OK | OK | 100 |
| COMP-7 | OK | OK | 97 | OK | OK | 70 |
| INV-2 | OK | OK | 99 | OK | OK | 100 |

From Table 8 it becomes apparent that the etch resist ink according to the present invention has the broadest application range over different etch conditions.

The invention claimed is:

1. A method of inkjet printing comprising the steps of:
   forming a protected area on a metal or glass surface by printing and curing on the metal or glass surface a radiation curable inkjet ink comprising:
   an adhesion promoter including:
   at least one free radical polymerizable group selected from the group consisting of an acrylate, a methacrylate, an acryl amide, and a methacryl amide;
   at least one aliphatic tertiary amine; and
   at least one carboxylic acid or salt thereof, wherein the carboxylic acid is linked to the at least one aliphatic tertiary amine via a divalent linking group selected from the group consisting of an optionally substituted methylene group and an optionally substituted ethylene group;
   removing metal or glass from an unprotected area of the metal or glass surface by etching; and
   at least partially removing the printed and cured radiation curable inkjet ink from the protected area of the metal or glass surface.

2. The method according to claim 1, wherein the at least one free radical polymerizable group is the acrylate or the methacrylate.

3. The method according to claim 1, wherein the divalent linking group is the optionally substituted methylene group.

4. The method according to claim 1, wherein the adhesion promoter includes at least two carboxylic acids or salts thereof linked to the at least one aliphatic tertiary amine via the optionally substituted methylene group.

5. The method according to claim 1, wherein the adhesion promoter includes at least one structural unit according to Formula I:

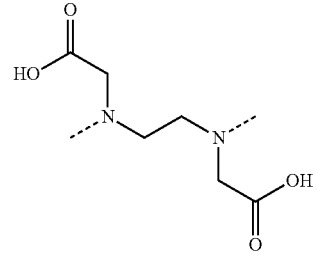

Formula I wherein the dashed lines represent covalent bonds to other portions of the adhesion promoter.

6. The method according to claim 1, wherein the adhesion promoter includes at least one structural unit according to Formula II:

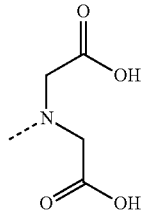

Formula II wherein the dashed line represents a covalent bond to another portion of the adhesion promoter.

7. The method according to claim 1, wherein the adhesion promoter includes at least one structural unit according to Formula III:

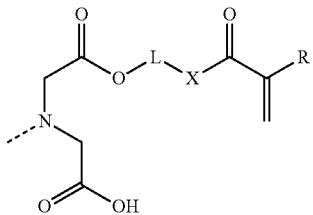

Formula III wherein
X is selected from the group consisting of O and NH;
R is a hydrogen or a methyl group; and
L represents a divalent linking group including from 2 to 15 carbon atoms.

8. The method according to claim 7, wherein
X is O; and
L represents a divalent linking group selected from the group consisting of an optionally substituted ethylene group, an optionally substituted propylene group, and an optionally substituted butylene group.

9. The method according to claim 1, wherein an amount of the adhesion promoter is between 1 and 20 wt % relative to a total weight of the radiation curable inkjet ink.

10. The method according to claim 1, further comprising an acryl amide or a di- or polyfunctional acrylate.

11. The method according to claim 10, wherein
the acryl amide includes a cyclic acryl amide; and
the di- or polyfunctional acrylate is selected from the group consisting of dipropylene glycol diacrylate, neopentylglycol diacrylate, neopentylglycol (2× propoxylated) diacrylate, penta erythritol tetraacrylate, 1,6-hexanediol diacrylate, trimethylolpropane tri methacrylate, ethoxylated tri methylolpropane triacrylate, tripropylene glycol diacrylate, ditrimethyloylpropane tetraacrylate, ethoxylated pentaerythritol tetraacrylate, and polyethyleneglycol diacrylate.

12. The method according to claim 1, wherein the metal or glass surface is a copper surface.

13. The method according to claim 1, wherein the step of curing is performed using UV radiation.

14. A method of manufacturing a conductive pattern comprising the inkjet printing method according to claim 1.

* * * * *